(12) United States Patent
Nariman et al.

(10) Patent No.: US 6,801,096 B1
(45) Date of Patent: Oct. 5, 2004

(54) RING OSCILLATOR WITH EMBEDDED SCATTEROMETRY GRATE ARRAY

(75) Inventors: Hormuzdiar E. Nariman, Austin, TX (US); Derick J. Wristers, Bee Caves, TX (US); James F. Buller, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/348,014

(22) Filed: Jan. 22, 2003

(51) Int. Cl.[7] ............................................. H03B 27/00
(52) U.S. Cl. ............................. 331/57; 438/8; 438/15; 356/341; 356/237.4
(58) Field of Search ................................ 331/57; 438/8, 438/15; 356/341, 237.4

(56) References Cited

U.S. PATENT DOCUMENTS

| | | | |
|---|---|---|---|
| 4,910,471 A | | 3/1990 | Brahmbhatt et al. |
| 5,004,339 A | * | 4/1991 | Pryor et al. ............... 356/241.1 |
| 6,383,824 B1 | | 5/2002 | Lensing |
| 6,432,729 B1 | * | 8/2002 | Mundt et al. ................. 438/8 |
| 6,433,871 B1 | | 8/2002 | Lensing et al. |

OTHER PUBLICATIONS

Junwei Bao et al., "Specular Spectral Profilometry On Metal Layers", Metrology, Inspection and Process of Control for Microlithography 2000, SPEI 3998–111, pp. 1–11.

Xinhui Nui et al., "Specular Spectroscopic Scatterometry in DUV Lithography", Timber Technology, Inc. and U.S. Berkeley, Advanced Micro Devices and Sematech Handout, 10 pg. handout.

* cited by examiner

Primary Examiner—Arnold Kinkead

(57) ABSTRACT

A MOS ring oscillator includes a number of serially connected inverter stages with each stage comprising a MOS transistor pair. At least one of the transistors also comprises a scatterometry grate array, which is used during manufacturing of the ring oscillator to obtain scatterometry measurements that allow polysilicon lines of the MOS ring oscillator to have widths of less than 60 nm. A method includes forming at least one grate array above a substrate, illuminating the grate array, measuring light reflected off of the grate array to generate an optical characteristic trace for the grate array, and comparing the generated optical characteristic trace to a target optical characteristic trace that corresponds to a grate array having a desired profile. The generated trace can further be used to calibrate the ring oscillator

20 Claims, 3 Drawing Sheets

RING OSCILLATOR WITH EMBEDDED SCATTEROMETRY GRATE ARRAY

FIELD OF THE INVENTION

The present invention relates to the manufacturing of semiconductor devices, and more particularly, to a metal-oxide-semiconductor (MOS) ring oscillator with an embedded scatterometry grate array. Scatterometry measurements can then be used to control processes for forming lines of the ring oscillator, and for forming semiconductor devices incorporating the ring oscillator.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. Types of MOS transistors include NMOS, PMOS and CMOS transistors. The MOS transistor is one of the basic building blocks of most modern electronic circuits. Importantly, these electronic circuits realize improved performance and lower costs, as the performance of the MOS transistor is increased and as manufacturing costs are reduced.

Typically, integrated circuit devices are comprised of millions of transistors formed above a semiconducting substrate. The semiconducting substrate or wafer is comprised of doped-silicon, doped with either N-type or P-type dopant materials. The transistor, for example, has a doped polycrystalline silicon (polysilicon) gate electrode formed above a gate insulation layer. The gate electrode and the gate insulation layer are separated from doped source/drain regions of the transistor by a dielectric sidewall spacer. The source/drain regions for the transistor may be formed by performing one or more ion implantation processes to introduce dopant atoms, e.g. arsenic or phosphorous for NMOS devices, boron for PMOS devices, into the substrate. Shallow trench isolation regions are provided to isolate the transistor electrically from neighboring semiconductor devices, such as other transistors. Additionally, a typical integrated circuit device is comprised of a plurality of conductive interconnections, such as conductive lines and conductive contacts or vias, positioned in multiple layers of insulating material formed above the substrate.

Standard digital logic circuit performance can be generalized relatively effectively by ring oscillator frequency. Processors formed from thousands and millions of transistors on a die normally include at least one ring oscillator circuit for providing frequency synthesis. A conventional ring oscillator circuit comprises an odd number of inverter stages serially connected in a ring. In a conventional MOS transistor ring oscillator, each stage comprises a p-channel transistor and an n-channel transistor pair serially connected between first and second voltage potentials, typically a positive supply voltage and ground. The cannon terminal of the transistors is the output of the stage and is connected to the gates of the succeeding transistor pair. A capacitor shunts the output terminal to ground.

Semnconductor manufacturing generally involves multiple processes whereby multiple layers of material are formed above a semiconducting substrate, and portions of those layers are selectively removed until such time as a completed device is formed. These layers may be patterned using known photolithography and etching techniques. In general, photolithography involves the process of forming a layer of photoresist material above one or more process layers in which a feature, e.g., a metal line, a gate electrode, an opening in a layer of insulating material, will be formed. Thereafter, a pattern that is desired to be transferred into the underlying process layer or layers will be formed in the layer of photoresist material. Then, using one or more etching processes, the underlying process layer is etched using the patterned layer of photoresist as a mask, thereby resulting in a patterned process layer that replicates the pattern formed in the layer of photoresist.

One illustrative process flow for forming a portion of a transistor includes forming a process layer comprised of a gate insulation material, e.g., silicon dioxide, above the semiconducting substrate. Typically, this is accomplished by an oxidation process. Then, a process layer comprised of a gate electrode material, e.g., polysilicon, is formed above the process layer. The polysilicon layer may be formed by a variety of processes, e.g., by a chemical vapor deposition ("CVD") process. If desired, an anti-reflective coating layer may also be formed above the polysilicon layer to reduce reflections during subsequent photolithography exposure processes. Me anti-reflective coating layer may be comprised of a variety of materials, e.g., silicon nitride, silicon oxynitride, etc. Thereafter, a patterned layer of photoresist material (positive or negative) is formed above the polysilicon layer using known photolithography techniques, and one or more etching processes will be performed to form 8 gate electrode array from the polysilicon layer using the patterned layer of photoresist as a mask.

One problem encountered with existing processes used to form lines of the devices is controlling the widths of the lines. Line width control is very important in modem semiconductor manufacturing operations. For example, if a conductive line is made too narrow or too wide, then the resistance of the line will be wrong and the line will not conduct the amount of charge that it is designed to conduct. Previously, the width of various device lines has been measured by a variety of metrology tools, such as an ellipsometer, a reflectomer, a spectrometer, or some combination thereof. These tools tend to work well for measuring flat, uniform thin films, but many modern semiconductor manufacturing processes depend less upon uniform film thickness than surface topography or profile of the process layer and device lines.

What is still desired is a new and improved metrology apparatus and method that may provide a more robust technique for measuring or determining the topography or surface profile of a process layer and device lines. Preferably, the new and improved metrology apparatus and method can be incorporated into a common circuit, such as a MOS transistor ring oscillator so that line widths can be measured properly and in-situ during the manufacturing of the transistor.

SUMMARY OF THE INVENTION

This and other needs are met by embodiments of the present invention which provides a MOS ring oscillator that includes a number of serially connected inverter stages with each stage comprising a MOS transistor pair. At least one of the transistors also comprises a scatterometry grate array, which can then be used during manufacturing of the ring oscillator to obtain scatterometry measurements that allow polysilicon lines of the MOS ring oscillator to have widths of less than 60 nm.

Embodiments of the present invention also provide a method of manufacturing a MOS ring oscillator on a die that includes forming at least one grate array above a substrate, illuminating the grate array, measuring light reflected off of the grate array to generate an optical characteristic trace for the grate array, and comparing the generated optical characteristic trace to a target optical characteristic trace that corresponds to a grate array having a desired profile. According to another embodiment, the method further includes depositing a process layer above the grate array, illuminating the process layer and the grate array, measuring light reflected off of the process layer and the grate array to generate an optical characteristic trace for the process layer and the grate array, and comparing the generated optical characteristic trace to a target optical characteristic trace that corresponds to a process layer having a desired profile. According to a farther aspect the method also includes using line width measurements obtained from the grate array to calibrate the ring oscillator.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

Figure 1:
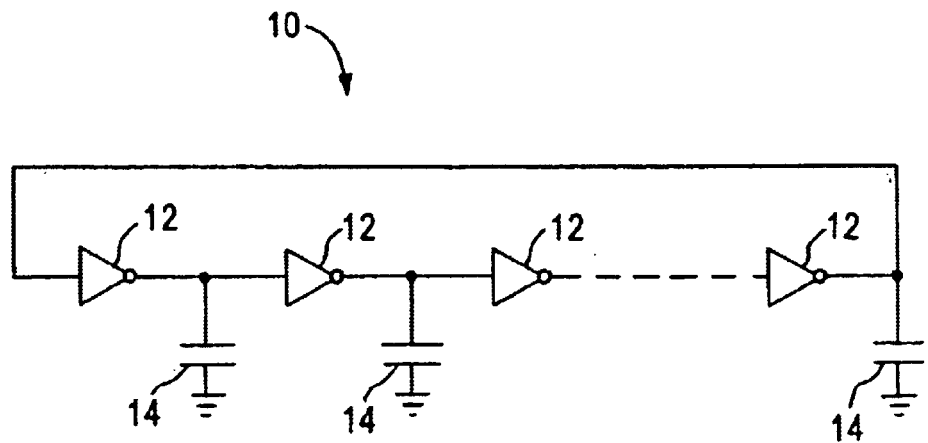
FIG. 1 is a schematic of a conventional ring oscillator of the prior art having an odd number of serially connected inverters.

Referring now to FIG. 1, a conventional ring oscillator 10 comprising a plurality of serially connected inverter circuits, or stages 12, is illustrated. Capacitive means 14 is associated with the output of each stage 12 which provides a delay in the changing of states between sequential stages 12.

Figure 2:
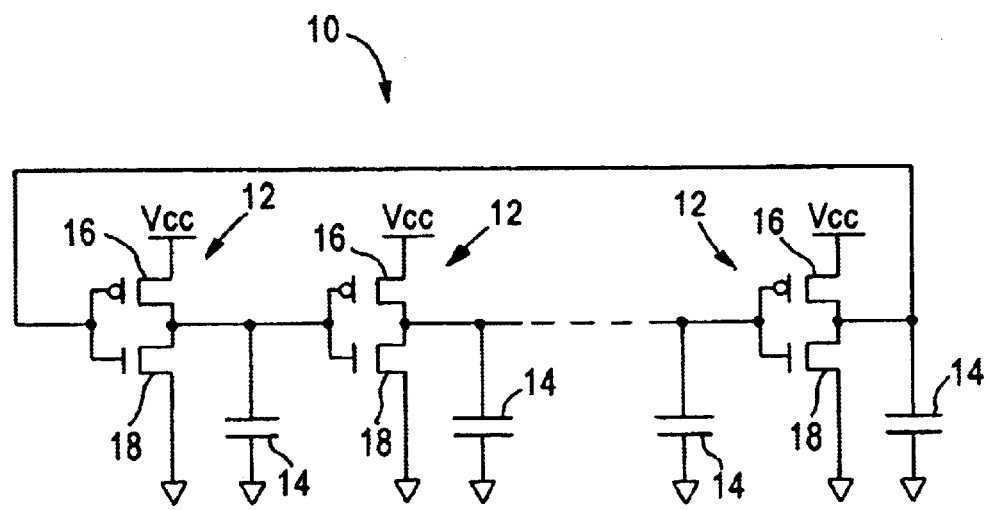
FIG. 2 is a schematic of a conventional ring oscillator of the prior art fabricated using CMOS transistor pairs.

FIG. 2 is a schematic of the conventional ring oscillator 10 of the configuration of FIG. 1 in which each stage 12 comprises a complementary metal-oxide-semiconductor (CMOS) transistor pair 16, 18. As illustrated, each stage 12 includes a p-channel transistor 16 serially connected with an n-channel transistor 18 between the supply voltage, $+V_{cc}$, and circuit ground. In the conventional CMOS ring oscillator 10 the gates of the two transistors 16, 18 in each stage are connected to the output of the preceding stage taken at the common terminal of the two serially connected transistors. The capacitor 14 shunts the output of each stage 12 to circuit ground. It is seen that the application of a "zero" (e.g. ground) to the input of one stage 12 causes conduction of the p-channel transistor 16, thereby charging the capacitor 14 at its output to the supply voltage, $V_{cc}$.

The charge on the capacitor 14 not only provides the bias voltage for the p-channel transistor 16 but also the bias voltage for the n-channel transistor 18. In such an arrangement, the discharge of each capacitor 14 through the n-channel transistor 18 of the preceding stage 12 is dependent on the gate bias voltage, $V_{cc}$. Accordingly, the frequency of oscillation of the circuit 10 depends not only on the number of stages 12 in the ring but also on the voltage of $V_{cc}$. That is, as $V_{cc}$ increases in voltage, the frequency of oscillation increases, and conversely when the voltage of $V_{oc}$ decreases, the frequency of oscillation also decreases due to the reduced discharge of each capacitor 14.

Figure 3:
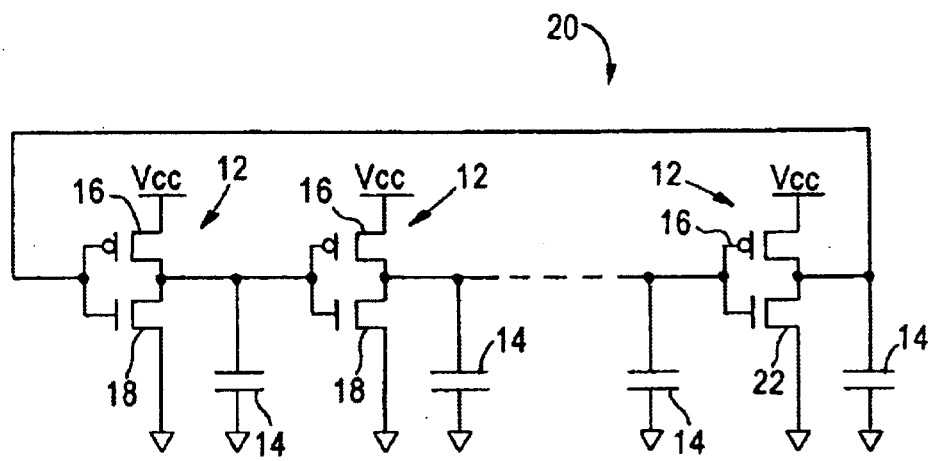
FIG. 3 is a schematic of an exemplary embodiment of a ring oscillator constructed in accordance with the present invention using CMOS transistor pairs, wherein at least one of the transistors also comprises a scatterometry grate array.
Figure 4:
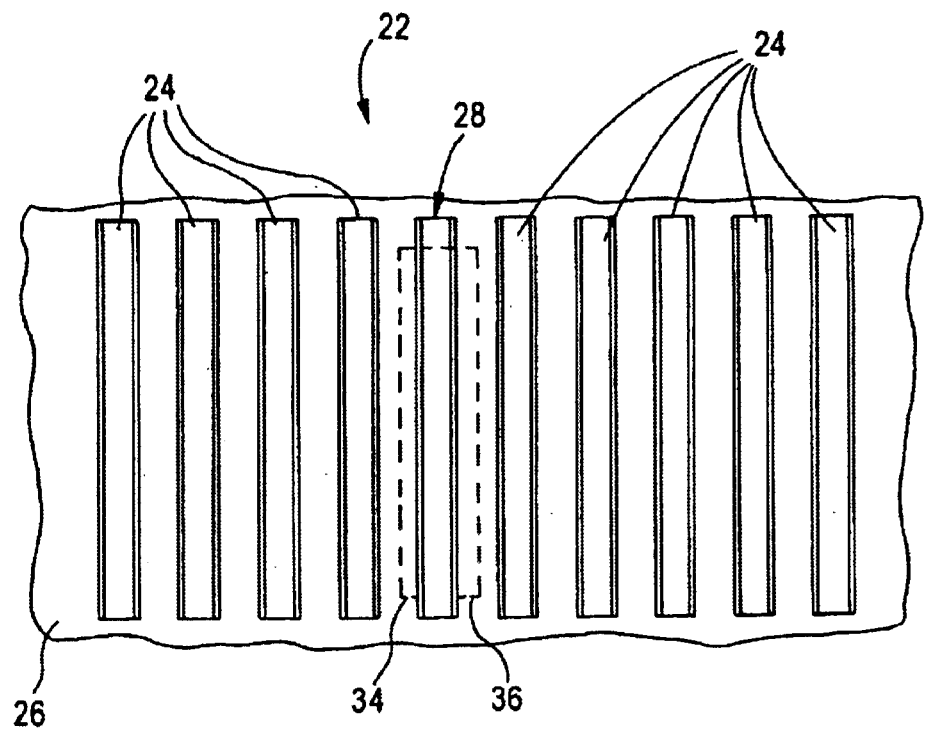
FIG. 4 is an enlarged plan view of the scatterometry grate array of the ring oscillator of FIG. 3.
Figure 5:
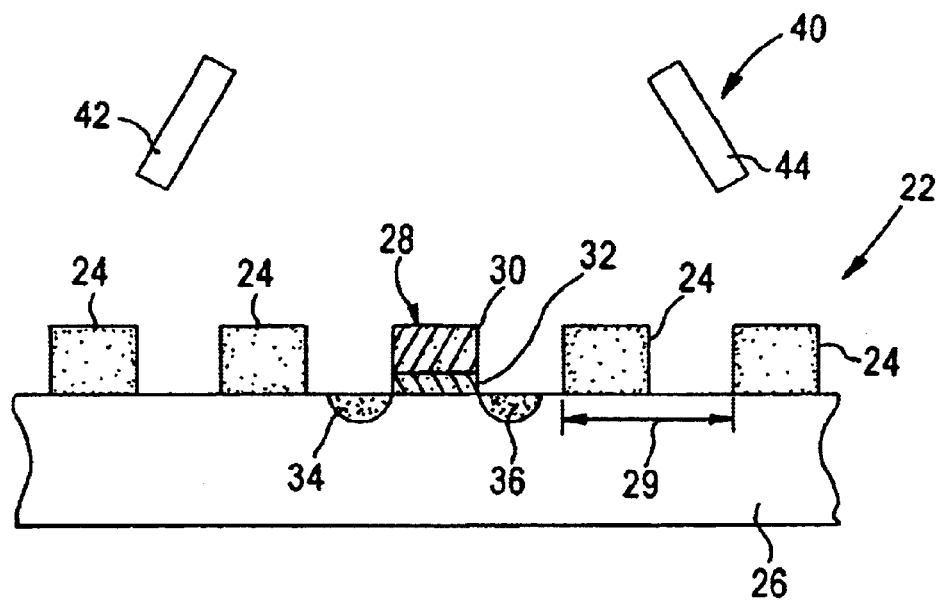
FIG. 5 depicts a method of manufacturing a CMOS ring oscillator on a die that includes forming at least one grate array, in accordance with an exemplary embodiment of the present invention.
Figure 6:
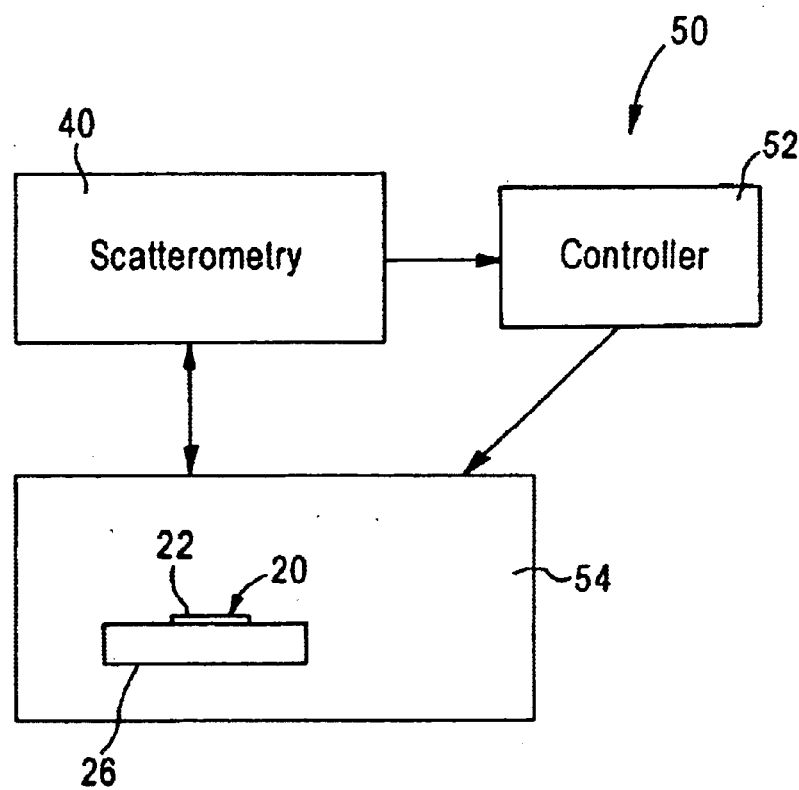
FIG. 6 depicts a system in accordance with one illustrative embodiment of the present invention for carrying out the method of FIG. 5 in order to produce the CMOS ring oscillator of FIG. 3.

The present invention provides a new and improved CMOS ring oscillator 20, as shown in FIGS. 3 through 5, and a method of forming a CMOS ring oscillator, as shown in FIGS. 5 and 6. In particular, the improved CMOS ring oscillator 20 of the present invention includes a plurality of serially connected inverter circuits 12, with each circuit including a p-channel transistor 16 serially connected with an n-channel transistor 18. At least one of the transistors also comprises a scatterometry grate array 22, which can then be used during manufacturing of the ring oscillator 20 to obtain scatterometry measurements that allow polysilicon lines of the CMOS ring oscillator 20 to have widths of less than 60 nm. The method of the present invention utilizes scatterometry measurements during the forming of the CMOS ring oscillator 20 using the scatterometry grate array 22 to determine polysilicon line widths of the resistors 16, 18. The apparatus and method of the present invention allows product and process performance optimization with polysilicon line widths below 60 nm. Measurements obtained from the grate array 22 can also be used to calibrate the ring oscillator 20.

As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc. Semiconductor manufacturing generally involves the formation of many process layers or films of materials above a semiconducting substrate. The process layers may be comprised of many different types of materials, e.g., insulating materials such as silicon dioxide and silicon oxynitride, etch stop layers such as silicon nitride, metals such as aluminum, other materials such as polysilicon, etc. Many of these layers are formed by a deposition process, e.g., chemical vapor deposition (CVD), physical vapor deposition (PVD), plasma enhanced chemical vapor deposition (PECVD), low pressure chemical vapor deposition (LPCVD), high density plasma (HD)P) deposition, etc. Lines are then formed in the layer(s), e.g., using photolithography and etching techniques. For many applications, it is desirable that the widths of the lines, both in an absolute sense and in relation to its width with respect to certain other features, be accurately controlled. As will be understood by those skilled in the art after reading the present application, the invention disclosed herein is readily applicable to a variety of process layers and lines, e.g., conductive metal lines or polysilicon line, that may be formed by a variety of line forming techniques, e.g., photolithography and etching techniques.

FIGS. 4 and 5 depicts one illustrative scatterometry grate array 22 that may be formed as part of the ring oscillator 20 of FIG. 3 in accordance with the present invention. As shown, the scatterometry grate array 22 includes a plurality of parallel lines 24, 28 formed on a semiconducting substrate 26, and one of the lines is further formed into a gate 28 having an oxide layer 32 and a metal layer 30. Source and drain regions 34, 36 are formed in the substrate 26 on opposite side of the gate 28.

The size and shape of the lines 24, 28 may be varied as a matter of design choice. As shown in FIG. 5, the grate array 22 may have a pitch 29 that, in one embodiment, may equal about 60 nm or less. The ring oscillator 20 can be provided with a plurality of such grate arrays 22, and a semiconductor device formed on a die can include a plurality of such ring oscillators 20 having the grate array 22 in accordance with the present invention.

Through use of scatterometry techniques, a target optical characteristic trace may be established for a desirable topography or surface profile of the array 22. Thereafter, as explained more fully below, scatterometry techniques may be used to control the processes used to find the ring oscillator 20 and surrounding semiconductor device, including line forming techniques such as photolithography and etching techniques. For example, in one illustrative embodiment, scatterometry techniques may be used to stop or endpoint the etching process used to form a conductive line(s) of the array 22 such that the profile of the surface of the process layer (i.e., the line widths) matches or closely approximates (within specified tolerances) the target optical characteristic trace for a profile of the surface that produces acceptable results in subsequent operations.

The target profile may be established by a variety of techniques. For example, the target profile trace may be established by performing various metrology tests on a die before and after it is subjected to line forming processes. Prior to processing, the line widths of the array 22 may be measured. Thereafter, the lines may be processed as desired. Then, various metrology tests may be performed, both destructive and non-destructive, to determine the acceptability of the processing operations. Once acceptable processing results are obtained, then an optical characteristic trace may be established (by calculation using Maxwell's equations) for an array having a profile that approximates or matches the profile of an array that produced the acceptable wafers after processing operations were complete.

Also depicted in FIG. 5 is an illustrative scatterometry tool 40 comprised of, among other things, a representative light source 42 and a detector 44. Ultimately, the grate array 22, and a process layer (not shown) formed over the grate array 22, are measured using scatterometric techniques, and the measurements are used to determine and/or confirm the endpoint of the processes used to form the lines of the array.

An illustrative system 50 that may be used in one embodiment of the present invention is shown in FIG. 6. The system 50 is comprised of the scatterometry tool 40, a process tool 54, e.g., an etching machine, and a controller 52. An illustrative wafer 26 is also depicted in FIG. 6. The wafer 26 is representative of wafers processed to the point where at least one ring oscillator 20 having a grate array 22, as described above, has been formed on the wafer 26. In one exemplary embodiment, the scatterometry tool 40 is an in-situ tool that is mounted to or integrated with the process tool 54.

A variety of scatterometry tools 40 may be used with the present invention. e.g., so-called 2-type systems and lens-type scatterometry tools. The scatterometry tool 40 may use white light, or some other wavelength or combination of wavelengths, depending on the specific implementation. Typically, the scatterometry tool 40 will generate an incident beam that has a wide spectral composition and wherein the intensity of the light changes slowly in comparison to changes in wavelength. The angle of incidence of the light may also vary, depending on the specific implementation. The profile traces generated by the scatterometry tool 40 may be based upon a comparison of light intensity to wavelength (for white light, fixed angle type scatterometry tools) or a comparison of intensity to incident angle (for angle resolved systems that use a single light source). For example, a spectroscopic ellipsometer (single angle, many wavelengths), or a laser (single wavelength, many angles) may be used with the present invention. Additionally, the light source and the detector may be arranged in a pattern of concentric circles, with the light source illuminating the grate array from a perpendicular orientation, e.g., a reflectometer. The intensity of the reflected light may be measured as s- and p-polarization over either multiple angles or at multiple wavelengths. In general, the scatterometry tool 40 includes optical hardware, such as an ellipsometer or reflectometer, and a data processing unit loaded with a scatterometry software application for processing data collected by the optical hardware.

In one exemplary embodiment, the present invention is directed to the use of scatterometric techniques to control a line forming process. For example, the present invention may be used to endpoint a line etching process, or to reduce or increase the rate of such a process. That is, the scatterometry tool 40 is used to measure or generate an optical characteristic trace of the grate array 22 at various times after the process used to form the grate array is started. The measured or generated optical characteristic trace is compared to a preestablished or target optical characteristic trace for a grate array having a desirable surface profile, i.e., line widths. This target profile of the grate array is one that produces acceptable results when the wafer 26 is subjected to subsequent operations. This target optical characteristic trace may be stored in a library in the scatterometry tool 40. Alternatively, as the magnitude of the difference between the generated trace and the target trace decreases, the rate of the process may be reduced.

The scatterometry tool 40 is used to measure or generate an optical characteristic trace of the grate array after the line forming process has been started. The frequency of the measurements taken by the scatterometry tool 40 may be varied as a matter of design choice. For example, during a typical process, the scatterometry tool 40 may generate an optical characteristic trace for the grate array 22 approximately every 2–5 seconds. Measurements may also be taken at different rates during the duration of the process, i.e., more measurements may be taken as the process nears endpoint. The line forming process may or may not be stopped during the period when the scatterometry measurements are being taken.

The optical characteristic trace generated by the scatterometry tool 40 may then be compared to the target optical characteristic trace. This comparison may be made within the scatterometry tool 40, or it may be made by the controller 52, or it may be made by some other controller within the manufacturing facility. Through use of this technique, the target optical characteristic trace may be used to endpoint the line forming process when the measured optical characteristic trace of the grate array 22 closely approximates or matches the target trace within some pre-selected specified tolerances. More particularly, when it is determined that the measured trace matches or closely approximates the target trace, the controller 52 may stop the deposition process performed in the tool 54.

The optical measurements of the grate array 22 may be performed on any desired number of wafers. For example, such measurements may be performed on all wafers in one or more lots, or on a representative number of wafers in a given lot. A single substrate may contain a plurality of grate arrays 22, and they may be spaced out above the surface of the substrate. Any number of such grate arrays 22 may be measured.

As a result of the present invention, the grate array 22, and thus the ring oscillator 20 and a semiconductor device incorporating the ring oscillator, may be formed with a more desired line width(s) and/or surface profile, and the formation process may be more precisely controlled. This results in the consistent production of semiconductor devices having desired surface profile characteristics that will enable subsequent operations to be performed more efficiently and effectively. Ultimately, the present invention may be useful in producing more semiconductor devices within acceptable tolerance levels, thereby improving device performance and increasing production yields. Accordingly, manufacturing efficiencies may be improved. Through use of the present invention, better process control may be achieved in modern semiconductor device manufacturing facilities.

The line width measurements obtained using the grate array and the scatterometry apparatus can also be used to calibrate the ring oscillator. For example, if the widths of lines of the ring oscillator is known, the frequency produced by the ring oscillator can be calculated and confirmed. Preferably, the ring oscillator is calibrated in-situ (e.g., within the etching tool) during formation of the ring oscillator.

The present invention, therefore, provides a new and improved CMOS ring oscillator 20 and a new and improved method of forming a CMOS ring oscillator 20 and semiconductor device incorporating the CMOS ring oscillator 20. Among other advantages, the method of the present invention produces a CMOS ring oscillator 20 with polysilicon line widths below 60 nm.

The present invention can be practiced by employing conventional materials, methodology and equipment. Accordingly, the details of such materials, equipment and methodology are not set forth herein in detail.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A ring oscillator comprising:
   a number of serially connected inverter stages, each stage including a p-channel transistor serially connected with an n-channel transistor; and
   wherein at least one of the transistors comprises a scatterometry grate array.

2. The ring oscillator according to claim 1, wherein the scatterometry grate array comprises a plurality of parallel polysilicon lines.

3. The ring oscillator according to claim 2, wherein one of the plurality of parallel polysilicon lines is comprised of an active dopant.

4. The ring oscillator according to claim 1, wherein the p-channel transistor is serially connected with the n-channel transistor between a first voltage potential and a second voltage potential, and with a common terminal of a serially connected transistor being an output.

5. The ring oscillator according to claim 4, wherein the output of one stage is connected to a gate terminal of the p-channel transistor in a succeeding stage.

6. The ring oscillator according to claim 5, further comprising a capacitor connected to each output.

7. The ring oscillator according to claim 6, further comprising a reference voltage connected to a gate of each n-channel transistor whereby the discharge of the capacitor of a preceding stage is relatively independent of the first voltage potential.

8. The ring oscillator according to claim 1, wherein the scatterometry grate array comprises a plurality of parallel polysilicon lines each having a thickness of less than 60 nm.

9. The ring oscillator according to claim 1, wherein the scatterometry grate array comprises a plurality of parallel polysilicon lines and at least one of the polysilicon lines is conductive.

10. A method, comprising:
    forming at least one grate array above a substrate, wherein the grate array forms part of a transistor of a ring oscillator;
    illuminating the grate array;
    measuring light reflected off of the grate array to generate an optical characteristic trace for the grate array;
    comparing the generated optical characteristic trace to a target optical characteristic trace that corresponds to a grate array having a desired surface profile; and
    controlling a process for forming the grate array based upon the comparison of the generated trace and the target trace.

11. The method of claim 10, wherein the process for forming the grate array comprises a line forming process.

12. The method of claim 10, wherein the generated trace is used to calibrate the ring oscillator.

13. The method of claim 10, wherein the grate array is formed of parallel polysilicon lines.

14. The method of claim 13, wherein one of the parallel polysilicon lines is doped.

15. The method of claim 10, wherein the ring oscillator includes a number of serially connected inverter stages having a p-channel transistor serially connected with an n-channel transistor, and wherein at least one of the transistors comprises the scatterometry grate array.

16. The method of claim 15, wherein the p-channel transistor is serially connected with the n-channel transistor between a first voltage potential and a second voltage potential, and with a common terminal of a serially connected transistor being an output.

17. The method of claim 16, wherein an output of one stage is connected to the gate terminal of the p-channel transistor in a succeeding stage.

18. The method of claim 17, further comprising a capacitor connected to each output.

19. The method of claim 18, further comprising a reference voltage connected to a gate of each n-channel transistor whereby the discharge of a capacitor of a preceding stage is relatively independent of the first voltage potential.

20. The method of claim 10, wherein the grate array comprises a plurality of parallel lines each having a thickness of less than 60 nm.

* * * * *